United States Patent
Xiao et al.

(10) Patent No.: US 9,922,997 B2
(45) Date of Patent: Mar. 20, 2018

(54) GOA CIRCUIT

(71) Applicant: Wuhan China Star Optoelectronics Technology Co., Ltd., Wuhan (CN)

(72) Inventors: Juncheng Xiao, Wuhan (CN); Shangcao Cao, Wuhan (CN); Ronglei Dai, Wuhan (CN); Yao Yan, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 240 days.

(21) Appl. No.: 15/026,594

(22) PCT Filed: Feb. 26, 2016

(86) PCT No.: PCT/CN2016/074610
§ 371 (c)(1),
(2) Date: Mar. 31, 2016

(87) PCT Pub. No.: WO2017/117851
PCT Pub. Date: Jul. 13, 2017

(65) Prior Publication Data
US 2018/0047751 A1    Feb. 15, 2018

(30) Foreign Application Priority Data
Jan. 4, 2016 (CN) .......................... 2016 1 0003304

(51) Int. Cl.
*H01L 27/12*        (2006.01)
*G09G 3/36*         (2006.01)
(Continued)

(52) U.S. Cl.
CPC ........ *H01L 27/124* (2013.01); *G02F 1/13454* (2013.01); *G02F 1/136286* (2013.01);
(Continued)

(58) Field of Classification Search
CPC ............... H01L 27/124; H01L 27/1222; H01L 27/1225; G02F 1/13454; G02F 1/136286; G09G 3/3659; G09G 3/3677
See application file for complete search history.

(56) References Cited

U.S. PATENT DOCUMENTS

| 9,847,069 | B2 * | 12/2017 | Zhao ..................... G09G 3/3677 |
| 2012/0008731 | A1 * | 1/2012 | Hsu ......................... G11C 19/28 377/79 |
| 2017/0309240 | A1 * | 10/2017 | Zhang .................. G09G 3/3677 |

FOREIGN PATENT DOCUMENTS

| CN | 105096879 A | 11/2015 |
| CN | 105206327 A | 12/2015 |

* cited by examiner

Primary Examiner — Phuc Dang
(74) Attorney, Agent, or Firm — Leong C. Lei

(57) ABSTRACT

Disclosed is a GOA circuit. By locating the thirteenth thin film transistor (T13) coupled with the tenth thin film transistor (T10) in series and controlled by the Mth clock signal (CK(M)) in the output module (400) of the nth stage GOA unit, as entering signal interrupt and performing touch scan, the output competition of the output ends (G(n)) can be prevented; by locating the twelfth thin film transistor (T12) controlled by the global control signal (Gas) in the output end pull-down module (600), and by setting the composite signal (CS) to be the pulse signal consistent with the touch scan signal as entering signal interrupt and performing touch scan, the twelfth thin film transistors (T12) of the GOA units of all stages can be activated, and the output ends of the GOA units of all stages outputs the composite signal (CS) consistent with the touch scan signal (TP).

15 Claims, 8 Drawing Sheets

(51) Int. Cl.
*G02F 1/1362* (2006.01)
*G02F 1/1345* (2006.01)
(52) U.S. Cl.
CPC ......... *G09G 3/3659* (2013.01); *G09G 3/3677* (2013.01); *H01L 27/1222* (2013.01); *H01L 27/1255* (2013.01); *G09G 2300/0408* (2013.01)

GOA CIRCUIT

FIELD OF THE INVENTION

The present invention relates to a display technology field, and more particularly to a GOA circuit.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

The GOA (Gate Driver on Array) technology, i.e. the array substrate row driving technology is to utilize the array manufacture process of the Thin Film Transistor (TFT) liquid crystal display to manufacture the gate driving circuit on the Thin Film Transistor array substrate for realizing the driving way of scanning the gates row by row. It possesses advantages of reducing the production cost and realizing the panel narrow frame design, and is utilized by many kinds of displays. The GOA circuit has two basic functions: the first is to output the gate scan driving circuit for driving the gate lines in the panel to activate the TFTs in the display areas and to charge the pixels; the second is the shift register function. When the output of one gate scan driving signal is accomplished, the output of the next gate scan driving signal is performed with the control of the clock signal, and the transfer carries on in sequence. The GOA technology can reduce the bonding procedure of the external IC and has potential to raise the productivity and lower the production cost. Meanwhile, it can make the liquid crystal display panel more suitable to the narrow frame or non frame design of display products.

The embedded touch control technology is to combine the touch control panel and the display panel as one, and to merge the function of the touch control panel into the liquid crystal panel to make the liquid crystal panel equipped with functions of display and sensing the touch control inputs at the same time. With the rapid development of the display technology, the touch control display panel has been widely applied and accepted, used by the people. For example, the smart phone, the flat panel computer and etc. all use the touch control display panel.

The present embedded touch control technology can be categorized into two types: one is that the touch control circuit is on the liquid crystal cell (On Cell), and the other is that the touch control circuit is inside the liquid crystal cell (In Cell).

The In Cell touch display panel requires signal interrupt function, in which as the GOA circuit normally works in display procedure, it has to shut down the output ends of the GOA units of all stages in the GOA circuit at arbitrary moment, and to stop the output of the gate scan driving signal for performing the touch scan. After the touch scan is accomplished, the GOA circuit returns to be normal, and continues to output the gate scan driving signal. However, as the single type GOA of prior art achieves the signal interrupt function, the competition risk outputted by the constant low voltage level signal, outputted by the clock signal and employed to pull down the end voltage level exists. Besides, pulling down the output end to constant low voltage level will interfere the touch scan signal, and cause the delay of the touch scan signal.

SUMMARY OF THE INVENTION

An objective of the present invention is to provide a GOA circuit, which can prevent the competition risk outputted by the constant low voltage level signal outputted by the clock signal and employed to pull down the end voltage level as the GOA circuit realizes the signal interrupt function in prior art, and can reduce the delay of the touch scan signal.

Fore realizing the aforesaid objective, the present invention provides a GOA circuit, comprising: GOA units of a plurality of stages which are cascade coupled, and the GOA unit of each stage comprises: a forward-backward scan control module, a forward-backward scan pull-down control module, a first node control module, an output module, a second node control module, an output end pull-down module, a voltage stabilizing module and a capacitor;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a first thin film transistor, and a gate of the first thin film transistor is electrically coupled to an output end of the two former n−2th stage GOA unit, and a source receives a forward scan control signal, and a drain is electrically coupled to a first node; and a second thin film transistor, and a gate of the second thin film transistor is electrically coupled to an output end of the two latter stage n+2th GOA unit, and a source receives a backward scan control signal, and a drain is electrically coupled to the first node;

the forward-backward scan pull-down control module comprises: a third thin film transistor, and a gate of the third thin film transistor receives the forward scan control signal, and a source receives a M+1th clock signal, and a drain is electrically coupled to a gate of an eighth thin film transistor; and a fourth thin film transistor, and a gate of the fourth thin film transistor receives the backward scan control signal, and a source receives a M−1th clock signal, and a drain is electrically coupled to the gate of the eighth thin film transistor;

the first node control module comprises: a fifth thin film transistor, and a gate of the fifth thin film transistor is electrically coupled to a second node, and a source receives a composite signal, and a drain is electrically coupled to the first node; and an eleventh thin film transistor, and a gate of the eleventh thin film transistor is electrically coupled to the output end of the two former n−2th stage GOA unit, and a source receives the composite signal, and a drain is electrically coupled to the second node;

the output module comprises: a tenth thin film transistor, and a gate of the tenth thin film transistor is electrically coupled to a drain of a seventh thin film transistor, and a source receives a Mth clock signal, and a drain is electrically coupled to a source of a thirteenth thin film transistor; the thirteenth thin film transistor, and a gate of the thirteenth thin film transistor receives the Mth clock signal, and a drain is electrically coupled to an output end;

the second node control module comprises: a sixth thin film transistor, and a gate of the sixth thin film transistor is electrically coupled to the first node, and a source receives the composite signal, and a drain is electrically coupled to the second node; and the eighth thin film transistor, and the gate of the eighth thin film transistor is electrically coupled to the drain of the third thin film transistor and the drain of the fourth third thin film transistor, and a source receives a constant voltage level, and a drain is electrically coupled to the second node;

the output end pull-down module comprises: a ninth thin film transistor, and a gate of the ninth thin film transistor is electrically coupled to the second node, and a source receives the composite signal, and a drain is electrically coupled to the output end; and a twelfth thin film transistor, and a gate of the twelfth thin film transistor receives a global control signal, and a source receives the composite signal, and a drain is electrically coupled to the output end;

the voltage stabilizing module comprises: the seventh thin film transistor, and a gate of the seventh thin film transistor receives the constant voltage level, and a source is electrically coupled to the first node, and a drain is electrically coupled to the gate of the tenth thin film transistor;

one end of the capacitor is electrically coupled to the second node, and the other end receives the composite signal;

as a panel performs normal display, the voltage levels of the composite signal and the constant voltage level are one high and one low, and the voltages of the forward scan control signal and the backward scan control signal are one high and one low, and the global control signal controls the twelfth thin film transistors in all stage GOA units to be deactivated, and the output end employs the Mth clock signal to be a gate scan driving signal to be outputted; as the panel enters signal interrupt and performs touch scan, the composite signal is a pulse signal consistent with a touch scan signal, and the voltages of the forward scan control signal and the backward scan control signal are high or low at the same time, and the Mth clock signal controls the thirteenth thin film transistor to be deactivated, and the global control signal controls the twelfth thin film transistors in all stage GOA units to be activated, and the output ends of all stage GOA units outputs the composite signal consistent with the touch scan signal.

In the first stage GOA unit and the second stage GOA unit, both the gate of the first thin film transistor and the gate of the eleventh first thin film transistor receive a start signal of the circuit.

In the next to last stage GOA unit and the last stage GOA unit, the gate of the second thin film transistor receives a start signal of the circuit.

Selectably, the respective thin film transistors are all N-type thin film transistors; as the panel performs normal display, the composite signal is low voltage level, and the constant voltage level is a constant high voltage level, and the global control signal is low voltage level, and all the respective clock signals are periodic high voltage level pulse signals; as the panel enters signal interrupt and performs touch scan, all the respective clock signals are low voltage level, and the global control signal is high voltage level.

As performing forward scan, the forward scan control signal is the constant high voltage level, and the backward scan control signal is low voltage level in normal display, and is high voltage level in signal interrupt and touch scan; as performing backward scan, the backward scan control signal is the constant high voltage level, and the forward scan control signal is low voltage level in normal display, and is high voltage level in signal interrupt and touch scan.

Selectably, the respective thin film transistors are all P-type thin film transistors; as the panel performs normal display, the composite signal is high voltage level, and the constant voltage level is a constant low voltage level, and the global control signal is high voltage level, and all the respective clock signals are periodic low voltage level pulse signals; as the panel enters signal interrupt and performs touch scan, all the respective clock signals are high voltage level, and the global control signal is low voltage level.

As performing forward scan, the forward scan control signal is the constant low voltage level, and the backward scan control signal is high voltage level in normal display, and is low voltage level in signal interrupt and touch scan; as performing backward scan, the backward scan control signal is the constant low voltage level, and the forward scan control signal is high voltage level in normal display, and is low voltage level in signal interrupt and touch scan.

The GOA circuit of the present invention comprises four clock signals: a first, a second, a third and a fourth clock signals; as the Mth clock signal is the fourth clock signal, the M+1th clock signal is the first clock signal; as the Mth clock signal is the first clock signal, the M−1th clock signal is the fourth clock signal.

Pulse periods of the first, second, third and fourth clock signals are the same, and while a pulse signal of the former clock signal is finished, a pulse signal of the latter clock signal is generated.

The present invention further provides a GOA circuit, comprising: GOA units of a plurality of stages which are cascade coupled, and the GOA unit of each stage comprises: a forward-backward scan control module, a forward-backward scan pull-down control module, a first node control module, an output module, a second node control module, an output end pull-down module, a voltage stabilizing module and a capacitor;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a first thin film transistor, and a gate of the first thin film transistor is electrically coupled to an output end of the two former n−2th stage GOA unit, and a source receives a forward scan control signal, and a drain is electrically coupled to a first node; and a second thin film transistor, and a gate of the second thin film transistor is electrically coupled to an output end of the two latter stage n+2th GOA unit, and a source receives a backward scan control signal, and a drain is electrically coupled to the first node;

the forward-backward scan pull-down control module comprises: a third thin film transistor, and a gate of the third thin film transistor receives the forward scan control signal, and a source receives a M+1th clock signal, and a drain is electrically coupled to a gate of an eighth thin film transistor; and a fourth thin film transistor, and a gate of the fourth thin film transistor receives the backward scan control signal, and a source receives a M−1th clock signal, and a drain is electrically coupled to the gate of the eighth thin film transistor;

the first node control module comprises: a fifth thin film transistor, and a gate of the fifth thin film transistor is electrically coupled to a second node, and a source receives a composite signal, and a drain is electrically coupled to the first node; and an eleventh thin film transistor, and a gate of the eleventh thin film transistor is electrically coupled to the output end of the two former n−2th stage GOA unit, and a source receives the composite signal, and a drain is electrically coupled to the second node;

the output module comprises: a tenth thin film transistor, and a gate of the tenth thin film transistor is electrically coupled to a drain of a seventh thin film transistor, and a source receives a Mth clock signal, and a drain is electrically coupled to a source of a thirteenth thin film transistor; the thirteenth thin film transistor, and a gate of the thirteenth thin film transistor receives the Mth clock signal, and a drain is electrically coupled to an output end;

the second node control module comprises: a sixth thin film transistor, and a gate of the sixth thin film transistor is electrically coupled to the first node, and a source receives the composite signal, and a drain is electrically coupled to the second node; and the eighth thin film transistor, and the gate of the eighth thin film transistor is electrically coupled to the drain of the third thin film transistor and the drain of the fourth third thin film transistor, and a source receives a constant voltage level, and a drain is electrically coupled to the second node;

the output end pull-down module comprises: a ninth thin film transistor, and a gate of the ninth thin film transistor is electrically coupled to the second node, and a source receives the composite signal, and a drain is electrically coupled to the output end; and a twelfth thin film transistor, and a gate of the twelfth thin film transistor receives a global control signal, and a source receives the composite signal, and a drain is electrically coupled to the output end;

the voltage stabilizing module comprises: the seventh thin film transistor, and a gate of the seventh thin film transistor receives the constant voltage level, and a source is electrically coupled to the first node, and a drain is electrically coupled to the gate of the tenth thin film transistor;

one end of the capacitor is electrically coupled to the second node, and the other end receives the composite signal;

as a panel performs normal display, the voltage levels of the composite signal and the constant voltage level are one high and one low, and the voltages of the forward scan control signal and the backward scan control signal are one high and one low, and the global control signal controls the twelfth thin film transistors in all stage GOA units to be deactivated, and the output end employs the Mth clock signal to be a gate scan driving signal to be outputted; as the panel enters signal interrupt and performs touch scan, the composite signal is a pulse signal consistent with a touch scan signal, and the voltages of the forward scan control signal and the backward scan control signal are high or low at the same time, and the Mth clock signal controls the thirteenth thin film transistor to be deactivated, and the global control signal controls the twelfth thin film transistors in all stage GOA units to be activated, and the output ends of all stage GOA units outputs the composite signal consistent with the touch scan signal;

wherein in the first stage GOA unit and the second stage GOA unit, both the gate of the first thin film transistor and the gate of the eleventh first thin film transistor receive a start signal of the circuit;

wherein in the next to last stage GOA unit and the last stage GOA unit, the gate of the second thin film transistor receives a start signal of the circuit;

wherein the GOA circuit comprises four clock signals: a first, a second, a third and a fourth clock signals; as the Mth clock signal is the fourth clock signal, the M+1th clock signal is the first clock signal; as the Mth clock signal is the first clock signal, the M−1th clock signal is the fourth clock signal.

The benefits of the present invention are: the present invention provides a GOA circuit. By locating the thirteenth thin film transistor coupled with the tenth thin film transistor in series and controlled by the Mth clock signal in the output module of the nth stage GOA unit, as the panel enters signal interrupt and performs touch scan, the output competition of the output ends due to the outputs of the clock signals can be prevented; by locating the twelfth thin film transistor controlled by the global control signal in the output end pull-down module, and by setting the composite signal to be the pulse signal consistent with the touch scan signal as the panel enters signal interrupt and performs touch scan, the twelfth thin film transistors of the GOA units of all stages can be activated, and the output ends of the GOA units of all stages outputs the composite signal consistent with the touch scan signal, and thus the voltage level jumps of the output ends of the GOA units of all stages are consistent with the touch scan signal to reduce the delay of the touch scan signal.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
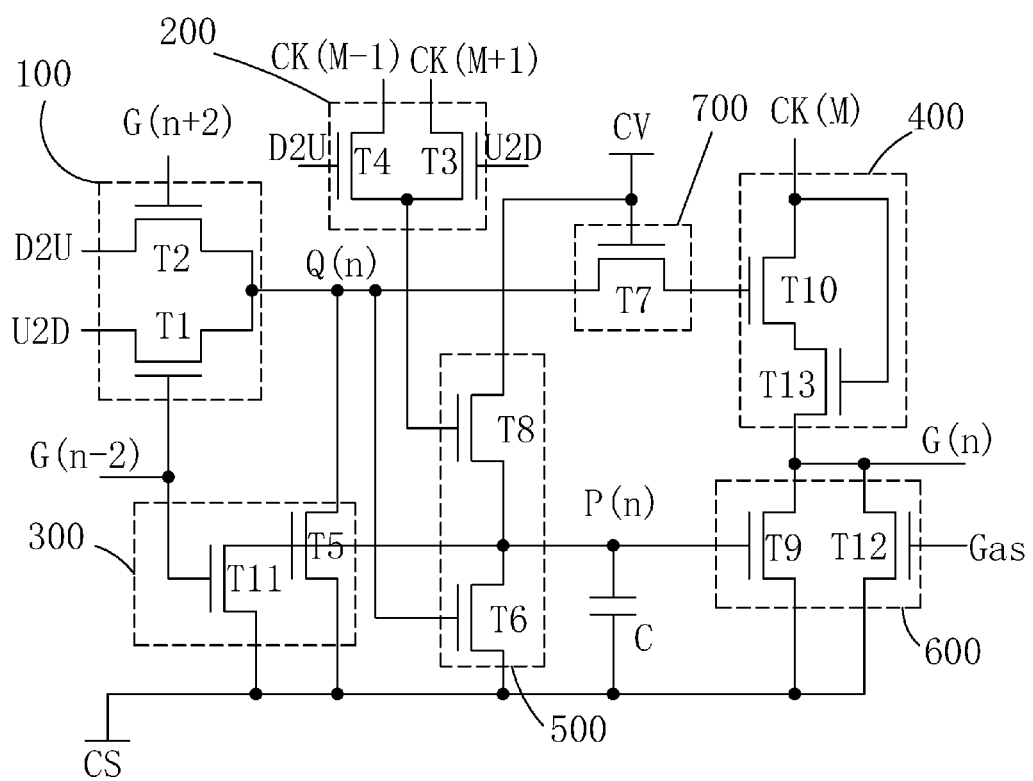
FIG. 1 is a circuit diagram of the first embodiment according to the GOA circuit of the present invention.
Figure 8:
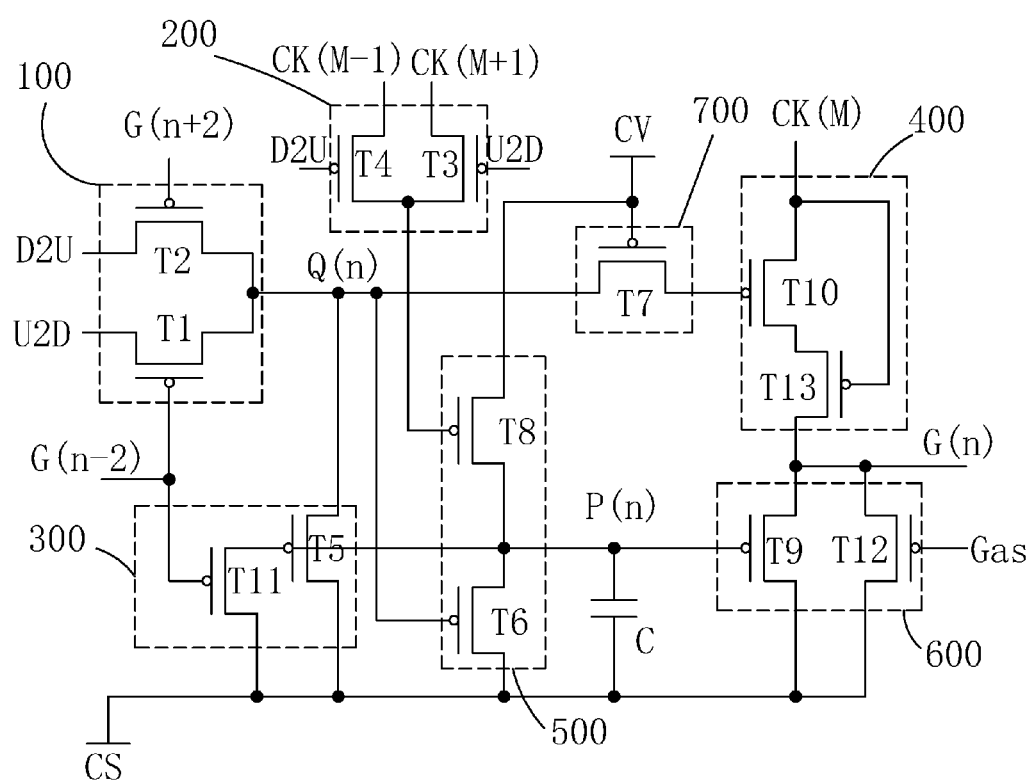
FIG. 8 is a circuit diagram of the second embodiment according to the GOA circuit of the present invention.

Please refer to FIG. 1 or FIG. 8. The present invention provides a GOA circuit with signal interrupt function, comprising a forward-backward scan control module 100, a forward-backward scan pull-down control module 200, a first node control module 300, an output module 400, a second node control module 500, an output end pull-down module 600, a voltage stabilizing module 700 and a capacitor C;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module 100 comprises: a first thin film transistor T1, and a gate of the first thin film transistor T1 is electrically coupled to an output end G(n−2) of the two former n−2th stage GOA unit, and a source receives a forward scan control signal U2D, and a drain is electrically coupled to a first node Q(n); and a second thin film transistor T2, and a gate of the second thin film transistor T2 is electrically coupled to an output end G(n+2) of the two latter stage n+2th GOA unit, and a source receives a backward scan control signal D2U, and a drain is electrically coupled to the first node Q(n);

the forward-backward scan pull-down control module 200 comprises: a third thin film transistor T3, and a gate of the third thin film transistor T3 receives the forward scan control signal U2D, and a source receives a M+1th clock signal CK(M+1), and a drain is electrically coupled to a gate of an eighth thin film transistor T8; and a fourth thin film transistor T4, and a gate of the fourth thin film transistor T4 receives the backward scan control signal D2U, and a source receives a M−1th clock signal CK(M−1), and a drain is electrically coupled to the gate of the eighth thin film transistor T8;

the first node control module 300 comprises: a fifth thin film transistor T5, and a gate of the fifth thin film transistor T5 is electrically coupled to a second node P(n), and a source receives a composite signal CS, and a drain is electrically coupled to the first node Q(n); and an eleventh thin film transistor T11, and a gate of the eleventh thin film transistor T11 is electrically coupled to the output end G(n−2) of the two former n−2th stage GOA unit, and a source receives the composite signal CS, and a drain is electrically coupled to the second node P(n);

the output module 400 comprises: a tenth thin film transistor T10, and a gate of the tenth thin film transistor T10 is electrically coupled to a drain of a seventh thin film transistor T7, and a source receives a Mth clock signal CK(M), and a drain is electrically coupled to a source of a thirteenth thin film transistor T13; the thirteenth thin film transistor T13, and a gate of the thirteenth thin film transistor T13 receives the Mth clock signal CK(M), and a drain is electrically coupled to an output end G(n);

the second node control module 500 comprises: a sixth thin film transistor T6, and a gate of the sixth thin film transistor T6 is electrically coupled to the first node Q(n), and a source receives the composite signal CS, and a drain is electrically coupled to the second node P(n); and the eighth thin film transistor T8, and the gate of the eighth thin film transistor T8 is electrically coupled to the drain of the third thin film transistor T3 and the drain of the fourth thin film transistor T4, and a source receives a constant voltage level CV, and a drain is electrically coupled to the second node P(n);

the output end pull-down module 600 comprises: a ninth thin film transistor T9, and a gate of the ninth thin film transistor T9 is electrically coupled to the second node P(n), and a source receives the composite signal CS, and a drain is electrically coupled to the output end G(n); and a twelfth thin film transistor T12, and a gate of the twelfth thin film transistor T12 receives a global control signal Gas, and a source receives the composite signal CS, and a drain is electrically coupled to the output end G(n);

the voltage stabilizing module 700 comprises: the seventh thin film transistor T7, and a gate of the seventh thin film transistor T7 receives the constant voltage level CV, and a source is electrically coupled to the first node Q(n), and a drain is electrically coupled to the gate of the tenth thin film transistor T10;

one end of the capacitor C is electrically coupled to the second node P(n), and the other end receives the composite signal CS.

as a panel performs normal display, the voltage levels of the composite signal CS and the constant voltage level CV are one high and one low, and the voltages of the forward scan control signal U2D and the backward scan control signal D2U are one high and one low, and the global control signal Gas controls the twelfth thin film transistors T12 in all stage GOA units to be deactivated, and the output end G(n) employs the Mth clock signal CK(M) to be a gate scan driving signal to be outputted; as the panel enters signal interrupt and performs touch scan, the composite signal CS is a pulse signal consistent with a touch scan signal TP, and the voltages of the forward scan control signal U2D and the backward scan control signal D2U are high or low at the same time, and the Mth clock signal CK(M) controls the thirteenth thin film transistor T13 to be deactivated, and the global control signal Gas controls the twelfth thin film transistors T12 in all stage GOA units to be activated, and the output ends of all stage GOA units outputs the composite signal CS consistent with the touch scan signal TP.

Figure 2:
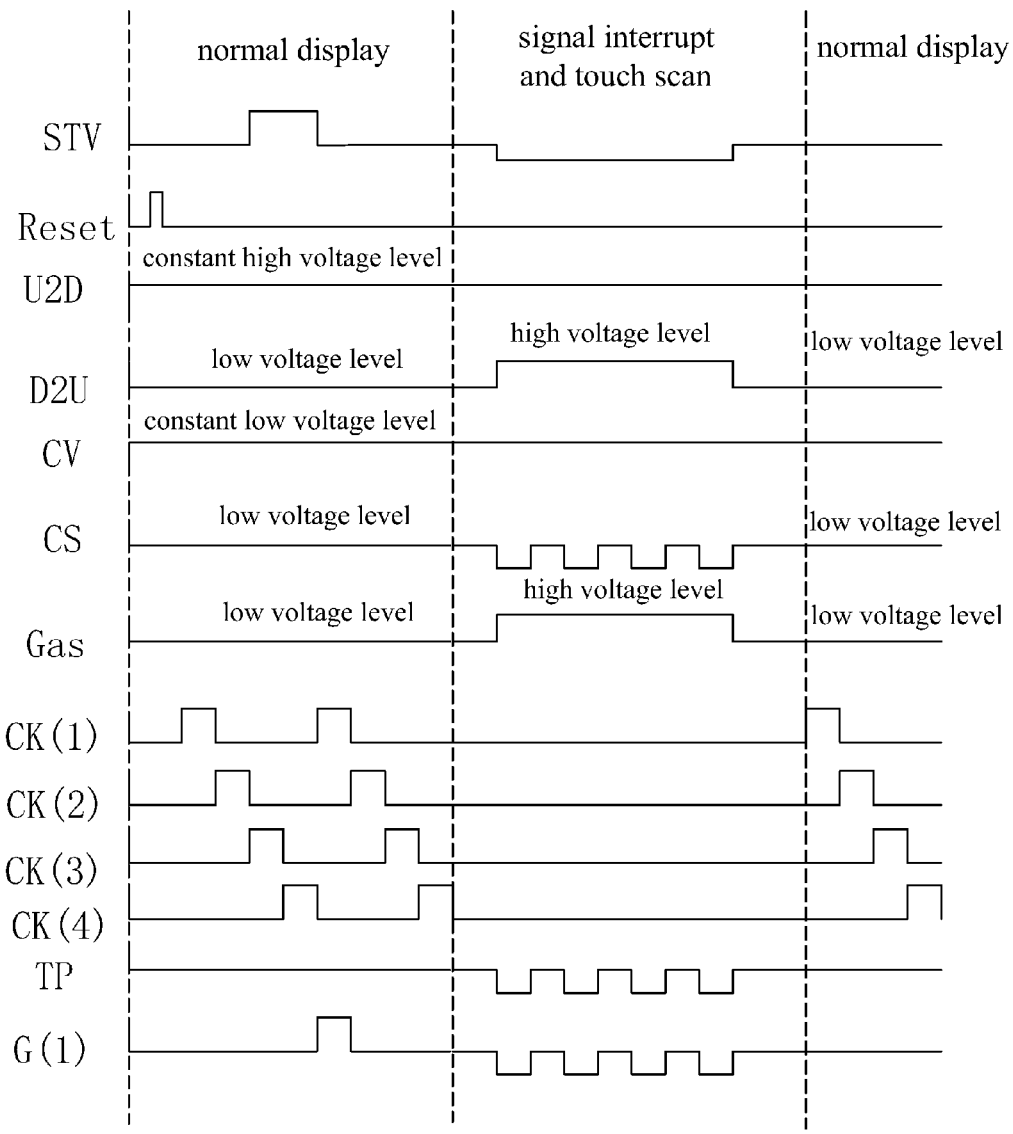
FIG. 2 is a sequence diagram as the GOA circuit shown in FIG. 1 performs forward scan.

Selectably, referring to FIG. 1 with combination of FIG. 2, in the first embodiment of the GOA circuit of the present invention, the respective thin film transistors are all N-type thin film transistors; as the panel performs normal display, the composite signal CS is low voltage level, and the constant voltage level CV is a constant high voltage level, and the global control signal Gas is low voltage level, and all the respective clock signals are periodic high voltage level pulse signals; as the panel enters signal interrupt and performs touch scan, all the respective clock signals are low voltage level, and the global control signal Gas is high voltage level. Furthermore, as performing forward scan, the forward scan control signal U2D is the constant high voltage level, and the backward scan control signal D2U is low voltage level in normal display, and is high voltage level in signal interrupt and touch scan; as performing backward scan, the backward scan control signal D2U is the constant high voltage level, and the forward scan control signal U2D is low voltage level in normal display, and is high voltage level in signal interrupt and touch scan.

Selectably, referring to FIG. 8, in the second embodiment of the GOA circuit of the present invention, the respective thin film transistors are all P-type thin film transistors; then, as the panel performs normal display, the composite signal CS is high voltage level, and the constant voltage level CV is a constant low voltage level, and the global control signal Gas is high voltage level, and all the respective clock signals are periodic low voltage level pulse signals; as the panel enters signal interrupt and performs touch scan, all the respective clock signals are high voltage level, and the global control signal Gas is low voltage level. Furthermore, as performing forward scan, the forward scan control signal U2D is the constant high voltage level, and the backward scan control signal D2U is low voltage level in normal display, and is high voltage level in signal interrupt and touch scan; as performing backward scan, the backward scan control signal D2U is the constant high voltage level, and the forward scan control signal U2D is low voltage level in normal display, and is high voltage level in signal interrupt and touch scan.

Figure 4:
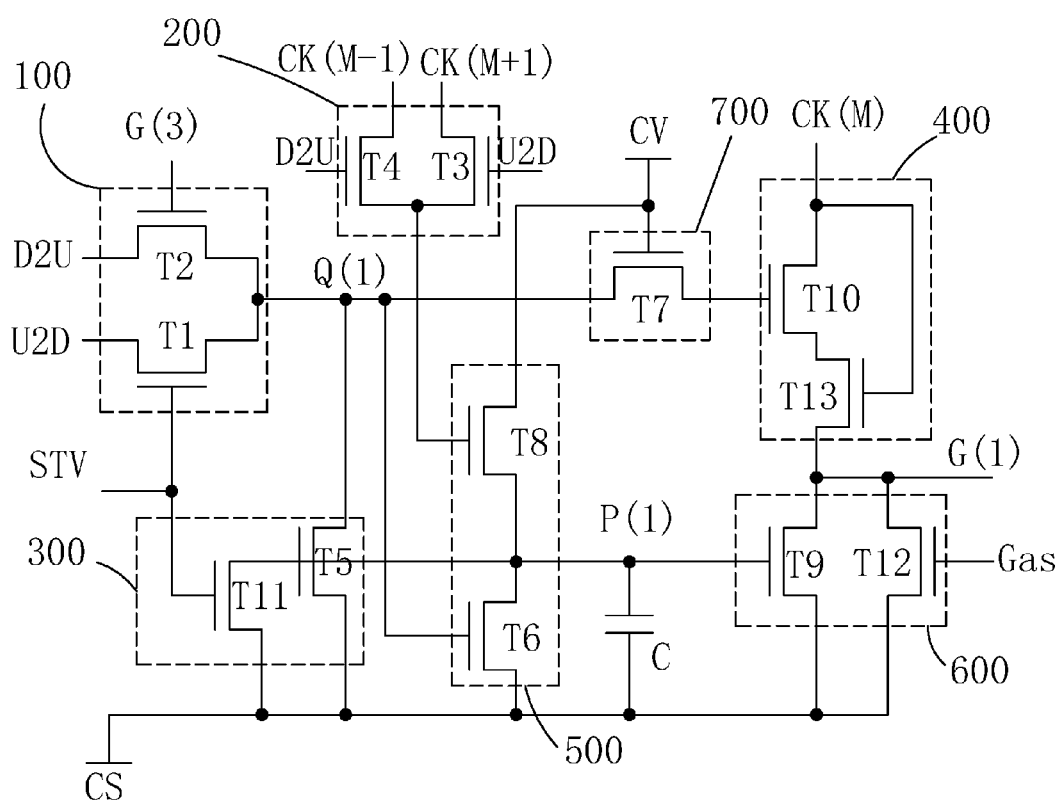
FIG. 4 is a circuit diagram of the first stage GOA unit of the first embodiment according to the GOA circuit of the present invention.
Figure 5:
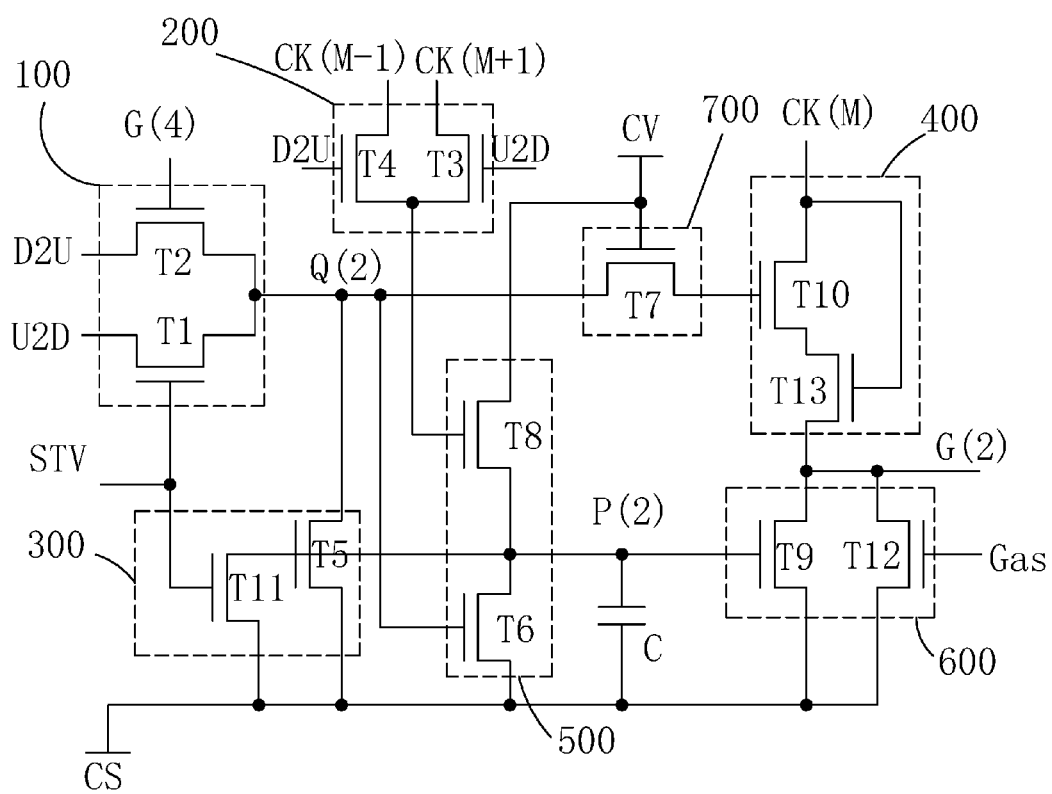
FIG. 5 is a circuit diagram of the second stage GOA unit of the first embodiment according to the GOA circuit of the present invention.
Figure 6:
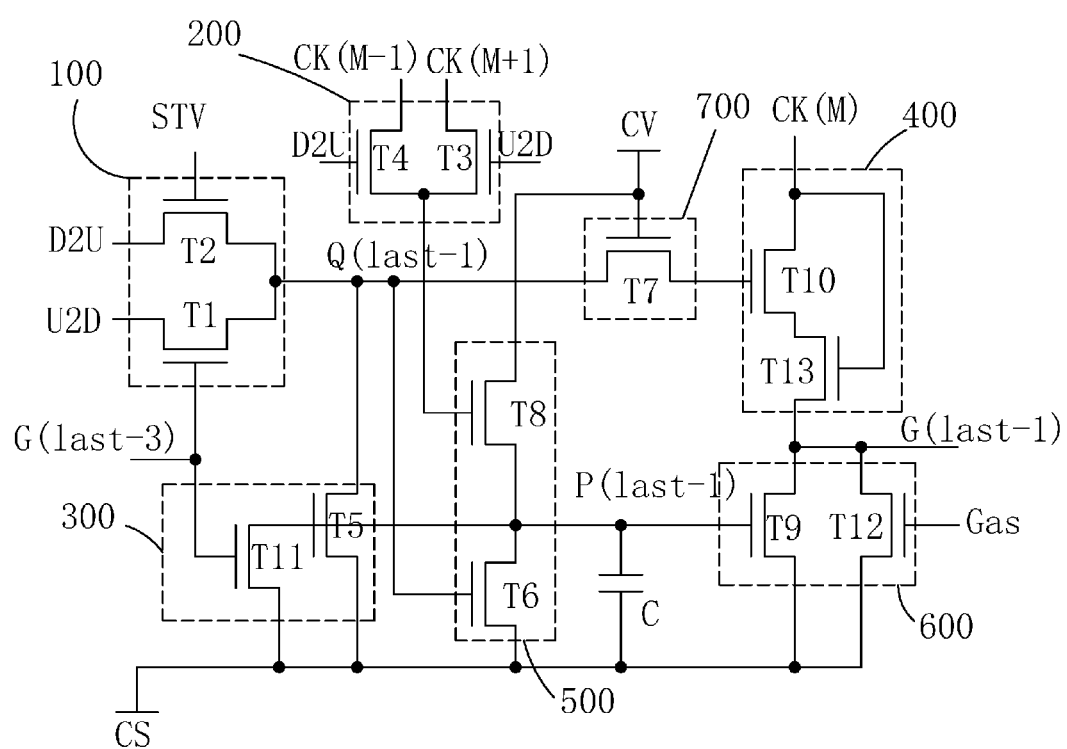
FIG. 6 is a circuit diagram of the next to last stage GOA unit of the first embodiment according to the GOA circuit of the present invention.
Figure 7:
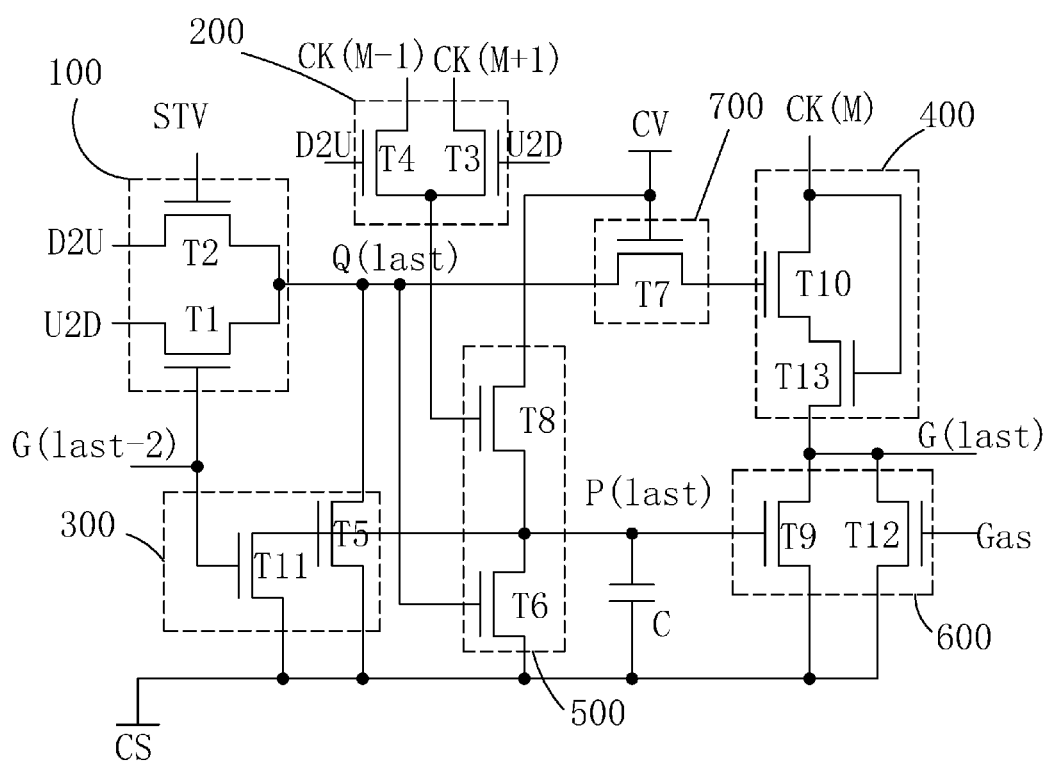
FIG. 7 is a circuit diagram of the last stage GOA unit of the first embodiment according to the GOA circuit of the present invention.

Particularly, referring to FIG. 4 and FIG. 5, in the first stage GOA unit and the second stage GOA unit, both the gate of the first thin film transistor T1 and the gate of the eleventh first thin film transistor T11 receive a start signal STV of the circuit. Please refer to FIG. 6 and FIG. 7. In the next to last stage GOA unit and the last stage GOA unit, the gate of the second thin film transistor T2 receives a start signal of the circuit.

Specifically, the GOA circuit comprises four clock signals: a first, a second, a third and a fourth clock signals CK(1), CK(2), CK(3), CK(4). As the Mth clock signal CK(M) is the fourth clock signal CK(4), the M+1th clock signal CK(M+1) is the first clock signal CK(1); as the Mth clock signal CK(M) is the first clock signal CK(1), the M−1 th clock signal CK(M−1) is the fourth clock signal CK(4).

As the panel performs normal display, the pulse periods of the first, the second, the third and the fourth clock signals CK(1), CK(2), CK(3), CK(4) are the same, and while a pulse signal of the former clock signal is finished, a pulse signal of the latter clock signal is generated. Namely, a first pulse signal of the first clock signal CK(1) is first generated, and a first pulse signal of the second clock signal CK(2) is generated at the same time while the first pulse signal of the first clock signal CK(1) is finished, and a first pulse signal of the third clock signal CK(3) is generated at the same time while the first pulse signal of the second clock signal CK(2) is finished, and a first pulse signal of the fourth clock signal CK(4) is generated at the same time while the first pulse signal of the third clock signal CK(3) is finished, and a second pulse signal of the first clock signal CK(1) is generated at the same time while the first pulse signal of the fourth clock signal CK(4) is finished. However, as the panel enters signal interrupt and performs touch scan, the first, the second, the third and the fourth clock signals CK(1), CK(2), CK(3), CK(4) are all low voltage levels. Furthermore, as applying in the first embodiment of the present invention, the falling edge of the former clock signal and the rising edge of the latter clock signal are generated at the same time; as applying in the second embodiment of the present invention, the rising edge of the former clock signal and the falling edge of the latter clock signal are generated at the same time.

Furthermore, the GOA circuit of the present invention performs scan with an interlaced scan manner, and the output end of the first stage GOA unit is electrically coupled to the third stage GOA unit, and the output end of the second stage GOA unit is electrically coupled to the fourth stage GOA unit, and the output end of the third stage GOA unit is electrically coupled to the fifth stage GOA unit, and the output end of the fourth stage GOA unit is electrically coupled to the sixth stage GOA unit, and so on.

Please refer to FIG. 1 and FIG. 2 at the same time. The forward scan of the first embodiment of the present invention is illustrated below for explaining the specific working procedure of the GOA circuit of the present invention:

1. normal display stage:

first, the output end G(n−2) of the n−2th GOA unit outputs high voltage level (in the first stage and the second stage GOA units, the start signal STV of the circuit provides high voltage level), and the first thin film transistor T1 is activated, and the forward scan control signal U2D of constant high voltage level charges the first node Q(n) to high voltage level through the first thin film transistor T1; the seventh thin film transistor T7, which is controlled by the constant voltage level CV is constantly activated; meanwhile, the eleventh thin film transistor T11 is activated, and the second node P(n) is pulled down to the low voltage level of the composite signal, and both the fifth and the ninth thin film transistors T5, T9 controlled by the second node P(n) are activated; the third thin film transistor T3 controlled by the forward scan control signal U2D is activated, and the M+1th clock signal CK(M+1) is low voltage level, and the eighth thin film transistor T8 is deactivated, and the Mth clock signal CK(M) is low voltage level, and the thirteenth thin film transistor T13 is deactivated, and the output end G(n) is low voltage level;

then, the output end of the n−2th GOA unit becomes low voltage levels, and the Mth clock signal CK(M) becomes high voltage level, and the thirteenth thin film transistor T13 is activated, and the first node Q(n) is kept to be high voltage level, and the tenth thin film transistor T10 controlled by first node Q(n) is activated, and the high voltage level of the Mth clock signal CK(M) is employed to be a gate scan driving signal to be outputted by the output end G(n) through the tenth and the thirteenth thin film transistors T10, T13; meanwhile, the sixth thin film transistor T6 controlled by first node Q(n) is activated, and the second node P(n) is kept to be low voltage level, and the fifth and the ninth thin film transistors T5, T9 are maintained to be deactivated;

and then, the Mth clock signal CK(M) becomes low voltage level, and the M+1th clock signal CK(M+1) provides high voltage level, and the eighth thin film transistor T8 is activated, and the high voltage level of the constant voltage level CV charges the second node P(n) to high voltage level through the eighth thin film transistor T8, the fifth thin film transistor T5 is activated, and the first node Q(n) is pulled down to the low voltage level of the composite signal CS, and the tenth and the thirteenth thin film transistors T10, T13 are deactivated, and the ninth thin film transistor T9 is activated, and the output end G(n) is pulled down to the low voltage level of the composite signal CS;

finally, the M+1th clock signal becomes low voltage level, and the second node P(n) is acted by storage function of the capacitor C to be kept to be high voltage level, and the output end G(n) is kept to be high voltage level;

in the entire normal display stage, all the twelfth thin film transistors T12 in the GOA units of the respective stages are controlled by the global control signal Gas of low voltage level to be constantly deactivated.

2. signal interrupt and touch scan stage:

the respective clock signals are all low voltage level, and all the thirteenth thin film transistors T13 in the GOA units of the respective stages are deactivated to block the output paths of the clock signals, and thus to prevent the output competition of the output ends due to the outputs of the clock signals; the global control signal Gas becomes high voltage level, and the twelfth thin film transistors T12 in the GOA units of the respective stages are activated, and all the output ends G(n) of the GOA units of the respective stages receive the composite signal CS, and then, the composite signal CS becomes a pulse signal consistent with a touch scan signal TP, and thus, the output ends of the GOA units of all stages output the composite signal CS consistent with the touch scan signal TP.

Figure 3:
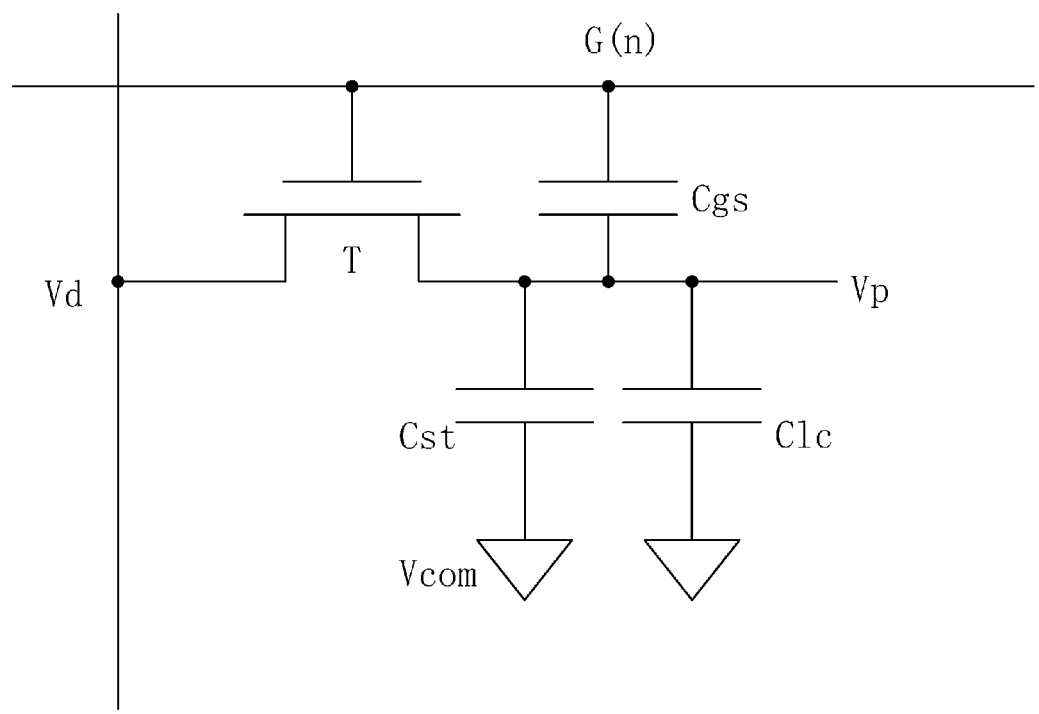
FIG. 3 is a driving circuit diagram of one pixel in the display panel according to prior art.

Furthermore, referring to FIG. 3, and FIG. 3 shows a driving circuit diagram of one pixel in the display panel according to prior art, comprising: a driving thin film transistor T, and a gate of the driving thin film transistor T is electrically coupled to an output end G(n) of the GOA unit of one stage in the GOA circuit, and a drain receives a data voltage Vd, and a source is electrically coupled to one ends of a storage capacitor Cst, a liquid crystal capacitor Clc and a gate-source capacitor Cgs; the storage capacitor Cst, the other end of the storage capacitor Cst is electrically coupled to a common voltage signal Vcom; the liquid crystal capacitor Clc, and the other end of the liquid crystal capacitor Clc is electrically coupled to the common voltage signal Vcom; the gate-source capacitor Cgs, and the other end of the gate-source capacitor Cgs is electrically coupled to the output end G(n) of the GOA unit of one stage in the GOA circuit.

In the signal interrupt and touch scan stage, the common voltage signal Vcom is employed to be the touch scan signal TP to output a periodic pulse signal. The other ends of the storage capacitor Cst and the liquid crystal capacitor Clc coupled to the common voltage signal Vcom occur the voltage level jumps, and then, the voltage level Vp of one ends of the storage capacitor Cst and the liquid crystal capacitor Clc coupled to the source of the driving thin film transistor T occur voltage level jumps, too. Then, the output end G(n) of the GOA unit of one stage in the GOA circuit outputs the composite signal, and if the composite signal still utilizes the constant low voltage level signal in prior art, the voltage difference will generate at two ends of the gate-source capacitor Cgs, and the common voltage signal Vcom, i.e. the periodic pulse of the touch scan signal TP occurs delay. On the contrary, the GOA circuit of the present invention sets the composite signal CS to be a periodic pulse signal consistent with the touch scan signal TP (here, the common voltage signal Vcom) in the signal interrupt and touch scan stage, and the voltage level jumps at the two ends of the gate-source capacitor Cgs are consistent, which can effectively shorten the delay of the touch scan signal TP.

Meanwhile, for the GOA units in the GOA circuit keeping the first node Q(n) to be high voltage level, although the tenth thin film transistors T10 in these GOA units are activated, the Mth clock signal CK(M) is low voltage level, and the thirteenth thin film transistor T13 is deactivated. In comparison with prior art, the competition output of the Mth clock signal CK(M) and the composite signal CS in the signal interrupt and touch scan stage can be effectively prevented to promote the stability of the touch scan.

3. finishing the signal interrupt and touch scan stage and entering the normal display stage, again.

The working procedure of the backward scan is similar with the forward scan. What is need is to change the backward scan control signal D2U to be constant high voltage level, and to change the forward scan control signal U2D to be low voltage level, and in signal interrupt and touch scan, it is set to be high voltage level, and the scan direction is changed from scanning from the first stage GOA unit toward the last stage GOA unit to be scanning from the last stage GOA unit toward the first stage GOA unit. No detail description is repeated here.

The second embodiment shown in FIG. 8 is similar with the specific working procedure of the aforesaid first embodiment. Only the high and low of the respective signals and nodes need to be changed. No detail description is repeated here.

In conclusion, in the GOA circuit of the present invention, by locating the thirteenth thin film transistor coupled with the tenth thin film transistor in series and controlled by the Mth clock signal in the output module of the nth stage GOA unit, as the panel enters signal interrupt and performs touch scan, the output competition of the output ends due to the outputs of the clock signals can be prevented; by locating the twelfth thin film transistor controlled by the global control signal in the output end pull-down module, and by setting the composite signal to be the pulse signal consistent with the touch scan signal as the panel enters signal interrupt and performs touch scan, the twelfth thin film transistors of the GOA units of all stages can be activated, and the output ends of the GOA units of all stages outputs the composite signal consistent with the touch scan signal, and thus the voltage level jumps of the output ends of the GOA units of all stages are consistent with the touch scan signal to reduce the delay of the touch scan signal.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit, comprising: GOA units of a plurality of stages which are cascade coupled, and the GOA unit of each stage comprises: a forward-backward scan control module, a forward-backward scan pull-down control module, a first node control module, an output module, a second node control module, an output end pull-down module, a voltage stabilizing module and a capacitor;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a first thin film transistor, and a gate of the first thin film transistor is electrically coupled to an output end of the two former n−2th stage GOA unit, and a source receives a forward scan control signal, and a drain is electrically coupled to a first node; and a second thin film transistor, and a gate of the second thin film transistor is electrically coupled to an output end of the two latter stage n+2th GOA unit, and a source receives a backward scan control signal, and a drain is electrically coupled to the first node;

the forward-backward scan pull-down control module comprises: a third thin film transistor, and a gate of the third thin film transistor receives the forward scan control signal, and a source receives a M+1th clock signal, and a drain is electrically coupled to a gate of an eighth thin film transistor; and a fourth thin film transistor, and a gate of the fourth thin film transistor receives the backward scan control signal, and a source receives a M−1th clock signal, and a drain is electrically coupled to the gate of the eighth thin film transistor;

the first node control module comprises: a fifth thin film transistor, and a gate of the fifth thin film transistor is electrically coupled to a second node, and a source receives a composite signal, and a drain is electrically coupled to the first node; and an eleventh thin film transistor, and a gate of the eleventh thin film transistor is electrically coupled to the output end of the two former n−2th stage GOA unit, and a source receives the composite signal, and a drain is electrically coupled to the second node;

the output module comprises: a tenth thin film transistor, and a gate of the tenth thin film transistor is electrically coupled to a drain of a seventh thin film transistor, and a source receives a Mth clock signal, and a drain is electrically coupled to a source of a thirteenth thin film transistor; the thirteenth thin film transistor, and a gate of the thirteenth thin film transistor receives the Mth clock signal, and a drain is electrically coupled to an output end;

the second node control module comprises: a sixth thin film transistor, and a gate of the sixth thin film transistor is electrically coupled to the first node, and a source receives the composite signal, and a drain is electrically coupled to the second node; and the eighth thin film transistor, and the gate of the eighth thin film transistor is electrically coupled to the drain of the third thin film transistor and the drain of the fourth third thin film transistor, and a source receives a constant voltage level, and a drain is electrically coupled to the second node;

the output end pull-down module comprises: a ninth thin film transistor, and a gate of the ninth thin film transistor is electrically coupled to the second node, and a source receives the composite signal, and a drain is electrically coupled to the output end; and a twelfth thin film transistor, and a gate of the twelfth thin film transistor receives a global control signal, and a source receives the composite signal, and a drain is electrically coupled to the output end;

the voltage stabilizing module comprises: the seventh thin film transistor, and a gate of the seventh thin film transistor receives the constant voltage level, and a source is electrically coupled to the first node, and a drain is electrically coupled to the gate of the tenth thin film transistor;

one end of the capacitor is electrically coupled to the second node, and the other end receives the composite signal;

as a panel performs normal display, the voltage levels of the composite signal and the constant voltage level are one high and one low, and the voltages of the forward scan control signal and the backward scan control signal are one high and one low, and the global control signal controls the twelfth thin film transistors in all stage GOA units to be deactivated, and the output end employs the Mth clock signal to be a gate scan driving signal to be outputted; as the panel enters signal interrupt and performs touch scan, the composite signal is a pulse signal consistent with a touch scan signal, and the voltages of the forward scan control signal and the backward scan control signal are high or low at the same time, and the Mth clock signal controls the thirteenth thin film transistor to be deactivated, and the global control signal controls the twelfth thin film transistors in all stage GOA units to be activated, and the output ends of all stage GOA units outputs the composite signal consistent with the touch scan signal.

2. The GOA circuit according to claim 1, wherein in the first stage GOA unit and the second stage GOA unit, both the gate of the first thin film transistor and the gate of the eleventh first thin film transistor receive a start signal of the circuit.

3. The GOA circuit according to claim 1, wherein in the next to last stage GOA unit and the last stage GOA unit, the gate of the second thin film transistor receives a start signal of the circuit.

4. The GOA circuit according to claim 1, wherein the respective thin film transistors are all N-type thin film transistors; as the panel performs normal display, the composite signal is low voltage level, and the constant voltage level is a constant high voltage level, and the global control signal is low voltage level, and all the respective clock signals are periodic high voltage level pulse signals; as the panel enters signal interrupt and performs touch scan, all the respective clock signals are low voltage level, and the global control signal is high voltage level.

5. The GOA circuit according to claim 4, wherein as performing forward scan, the forward scan control signal is the constant high voltage level, and the backward scan control signal is low voltage level in normal display, and is high voltage level in signal interrupt and touch scan; as performing backward scan, the backward scan control signal is the constant high voltage level, and the forward scan control signal is low voltage level in normal display, and is high voltage level in signal interrupt and touch scan.

6. The GOA circuit according to claim 1, wherein the respective thin film transistors are all P-type thin film transistors; as the panel performs normal display, the composite signal is high voltage level, and the constant voltage level is a constant low voltage level, and the global control signal is high voltage level, and all the respective clock signals are periodic low voltage level pulse signals; as the panel enters signal interrupt and performs touch scan, all the respective clock signals are high voltage level, and the global control signal is low voltage level.

7. The GOA circuit according to claim 6, wherein as performing forward scan, the forward scan control signal is the constant low voltage level, and the backward scan control signal is high voltage level in normal display, and is low voltage level in signal interrupt and touch scan; as performing backward scan, the backward scan control signal is the constant low voltage level, and the forward scan control signal is high voltage level in normal display, and is low voltage level in signal interrupt and touch scan.

8. The GOA circuit according to claim 1, wherein the GOA circuit comprises four clock signals: a first, a second, a third and a fourth clock signals; as the Mth clock signal is the fourth clock signal, the M+1th clock signal is the first clock signal; as the Mth clock signal is the first clock signal, the M−1th clock signal is the fourth clock signal.

9. The GOA circuit according to claim 8, wherein pulse periods of the first, second, third and fourth clock signals are the same, and while a pulse signal of the former clock signal is finished, a pulse signal of the latter clock signal is generated.

10. A GOA circuit, comprising: GOA units of a plurality of stages which are cascade coupled, and the GOA unit of each stage comprises: a forward-backward scan control module, a forward-backward scan pull-down control module, a first node control module, an output module, a second node control module, an output end pull-down module, a voltage stabilizing module and a capacitor;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a first thin film transistor, and a gate of the first thin film transistor is electrically coupled to an output end of the two former n−2th stage GOA unit, and a source receives a forward scan control signal, and a drain is electrically coupled to a first node; and a second thin film transistor, and a gate of the second thin film transistor is electrically coupled to an output end of the two latter stage n+2th GOA unit, and a source receives a backward scan control signal, and a drain is electrically coupled to the first node;

the forward-backward scan pull-down control module comprises: a third thin film transistor, and a gate of the third thin film transistor receives the forward scan control signal, and a source receives a M+1th clock signal, and a drain is electrically coupled to a gate of an eighth thin film transistor; and a fourth thin film transistor, and a gate of the fourth thin film transistor receives the backward scan control signal, and a source receives a M−1th clock signal, and a drain is electrically coupled to the gate of the eighth thin film transistor;

the first node control module comprises: a fifth thin film transistor, and a gate of the fifth thin film transistor is electrically coupled to a second node, and a source receives a composite signal, and a drain is electrically coupled to the first node; and an eleventh thin film transistor, and a gate of the eleventh thin film transistor is electrically coupled to the output end of the two former n−2th stage GOA unit, and a source receives the composite signal, and a drain is electrically coupled to the second node;

the output module comprises: a tenth thin film transistor, and a gate of the tenth thin film transistor is electrically coupled to a drain of a seventh thin film transistor, and a source receives a Mth clock signal, and a drain is electrically coupled to a source of a thirteenth thin film transistor; the thirteenth thin film transistor, and a gate of the thirteenth thin film transistor receives the Mth clock signal, and a drain is electrically coupled to an output end;

the second node control module comprises: a sixth thin film transistor, and a gate of the sixth thin film transistor is electrically coupled to the first node, and a source receives the composite signal, and a drain is electrically coupled to the second node; and the eighth thin film transistor, and the gate of the eighth thin film transistor is electrically coupled to the drain of the third thin film transistor and the drain of the fourth third thin film transistor, and a source receives a constant voltage level, and a drain is electrically coupled to the second node;

the output end pull-down module comprises: a ninth thin film transistor, and a gate of the ninth thin film transistor is electrically coupled to the second node, and a source receives the composite signal, and a drain is electrically coupled to the output end; and a twelfth thin film transistor, and a gate of the twelfth thin film transistor receives a global control signal, and a source receives the composite signal, and a drain is electrically coupled to the output end;

the voltage stabilizing module comprises: the seventh thin film transistor, and a gate of the seventh thin film transistor receives the constant voltage level, and a source is electrically coupled to the first node, and a drain is electrically coupled to the gate of the tenth thin film transistor;

one end of the capacitor is electrically coupled to the second node, and the other end receives the composite signal;

as a panel performs normal display, the voltage levels of the composite signal and the constant voltage level are one high and one low, and the voltages of the forward scan control signal and the backward scan control signal are one high and one low, and the global control signal controls the twelfth thin film transistors in all stage GOA units to be deactivated, and the output end employs the Mth clock signal to be a gate scan driving signal to be outputted; as the panel enters signal interrupt and performs touch scan, the composite signal is a pulse signal consistent with a touch scan signal, and the voltages of the forward scan control signal and the backward scan control signal are high or low at the same time, and the Mth clock signal controls the thirteenth thin film transistor to be deactivated, and the global control signal controls the twelfth thin film transistors in all stage GOA units to be activated, and the output ends of all stage GOA units outputs the composite signal consistent with the touch scan signal;

wherein in the first stage GOA unit and the second stage GOA unit, both the gate of the first thin film transistor and the gate of the eleventh first thin film transistor receive a start signal of the circuit;

wherein in the next to last stage GOA unit and the last stage GOA unit, the gate of the second thin film transistor receives a start signal of the circuit;

wherein the GOA circuit comprises four clock signals: a first, a second, a third and a fourth clock signals; as the Mth clock signal is the fourth clock signal, the M+1th clock signal is the first clock signal; as the Mth clock signal is the first clock signal, the M−1th clock signal is the fourth clock signal.

11. The GOA circuit according to claim 10, wherein the respective thin film transistors are all N-type thin film transistors; as the panel performs normal display, the composite signal is low voltage level, and the constant voltage level is a constant high voltage level, and the global control signal is low voltage level, and all the respective clock signals are periodic high voltage level pulse signals; as the panel enters signal interrupt and performs touch scan, all the respective clock signals are low voltage level, and the global control signal is high voltage level.

12. The GOA circuit according to claim 11, wherein as performing forward scan, the forward scan control signal is the constant high voltage level, and the backward scan control signal is low voltage level in normal display, and is high voltage level in signal interrupt and touch scan; as performing backward scan, the backward scan control signal is the constant high voltage level, and the forward scan control signal is low voltage level in normal display, and is high voltage level in signal interrupt and touch scan.

13. The GOA circuit according to claim 10, wherein the respective thin film transistors are all P-type thin film transistors; as the panel performs normal display, the composite signal is high voltage level, and the constant voltage level is a constant low voltage level, and the global control signal is high voltage level, and all the respective clock signals are periodic low voltage level pulse signals; as the panel enters signal interrupt and performs touch scan, all the respective clock signals are high voltage level, and the global control signal is low voltage level.

14. The GOA circuit according to claim 13, wherein as performing forward scan, the forward scan control signal is the constant low voltage level, and the backward scan control signal is high voltage level in normal display, and is low voltage level in signal interrupt and touch scan; as performing backward scan, the backward scan control signal is the constant low voltage level, and the forward scan control signal is high voltage level in normal display, and is low voltage level in signal interrupt and touch scan.

15. The GOA circuit according to claim 10, wherein pulse periods of the first, second, third and fourth clock signals are the same, and while a pulse signal of the former clock signal is finished, a pulse signal of the latter clock signal is generated.

\* \* \* \* \*